(12) United States Patent
Morroni et al.

(10) Patent No.: US 10,734,313 B2
(45) Date of Patent: Aug. 4, 2020

(54) INTEGRATION OF A PASSIVE COMPONENT IN AN INTEGRATED CIRCUIT PACKAGE

(71) Applicant: TEXAS INSTRUMENTS INCORPORATED, Dallas, TX (US)

(72) Inventors: Jeffrey Morroni, Parker, TX (US); Rajeev Dinkar Joshi, Cupertino, CA (US); Sreenivasan K. Koduri, Allen, TX (US); Sujan Kundapur Manohar, Dallas, TX (US); Yogesh K. Ramadass, San Jose, CA (US); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/951,021

(22) Filed: Apr. 11, 2018

(65) Prior Publication Data
US 2018/0301404 A1   Oct. 18, 2018

Related U.S. Application Data

(60) Provisional application No. 62/484,494, filed on Apr. 12, 2017, provisional application No. 62/612,248, filed on Dec. 29, 2017.

(51) Int. Cl.
| | | |
|---|---|---|
| H01L 23/495 | (2006.01) | |
| H01L 25/065 | (2006.01) | |
| H01L 23/31 | (2006.01) | |
| H01L 23/29 | (2006.01) | |
| H01L 23/498 | (2006.01) | |
| H01L 25/16 | (2006.01) | |
| H01L 23/50 | (2006.01) | |

(52) U.S. Cl.
CPC ........ *H01L 23/49589* (2013.01); *H01L 23/29* (2013.01); *H01L 23/315* (2013.01); *H01L 23/49861* (2013.01); *H01L 25/0657* (2013.01); *H01L 25/16* (2013.01); *H01L 23/49548* (2013.01); *H01L 23/50* (2013.01); *H01L 2224/16245* (2013.01); *H01L 2924/181* (2013.01); *H01L 2924/19103* (2013.01)

(58) Field of Classification Search
CPC ......... H01L 23/49565; H01L 23/49589; H01L 23/49582; H01L 25/0657; H01L 23/49524
USPC ................ 257/666, 676, 723, 724, 686, 777
See application file for complete search history.

(56) References Cited

U.S. PATENT DOCUMENTS

| | | |
|---|---|---|
| 5,115,298 A | 5/1992 | Loh |
| 5,212,402 A | 5/1993 | Higgins, III |
| 8,102,040 B2 * | 1/2012 | Chow ................ H01L 23/3135 257/666 |

(Continued)

OTHER PUBLICATIONS

International Search Report for PCT/US 2018/027308 dated Jun. 28, 2018.

*Primary Examiner* — S. V. Clark
(74) *Attorney, Agent, or Firm* — Dawn Jos; Charles A. Brill; Frank D. Cimino

(57) ABSTRACT

A semiconductor package includes a leadframe and a semiconductor die attached to the leadframe by way of solder posts. In a stacked arrangement, the package also includes a passive component disposed between the leadframe and the semiconductor die and electrically connected to the semiconductor die through the leadframe.

7 Claims, 10 Drawing Sheets

(56) References Cited

U.S. PATENT DOCUMENTS

| | | | |
|---|---|---|---|
| 8,169,058 B2* | 5/2012 | Pagaila | H01L 21/568 |
| | | | 257/629 |
| 8,786,068 B1* | 7/2014 | Phillips | H01L 24/37 |
| | | | 257/686 |
| 9,082,607 B1 | 7/2015 | Nondhasitthichai et al. | |
| 2002/0003294 A1 | 1/2002 | Bissey | |
| 2002/0130397 A1* | 9/2002 | Yew | H01L 23/24 |
| | | | 257/666 |
| 2002/0145180 A1* | 10/2002 | Terui | H01L 23/3128 |
| | | | 257/666 |
| 2005/0006730 A1* | 1/2005 | Owens | H01L 23/3107 |
| | | | 257/666 |
| 2005/0173783 A1* | 8/2005 | Chow | H01L 21/56 |
| | | | 257/666 |
| 2005/0212105 A1 | 9/2005 | Kwon et al. | |
| 2011/0215466 A1* | 9/2011 | Hsu | H01L 23/544 |
| | | | 257/737 |
| 2012/0086090 A1 | 4/2012 | Sharma et al. | |
| 2012/0187555 A1* | 7/2012 | Ong | H01L 23/3128 |
| | | | 257/693 |
| 2013/0087898 A1* | 4/2013 | Chi | H01L 21/4832 |
| | | | 257/666 |
| 2013/0181332 A1* | 7/2013 | Kelkar | H01L 23/3107 |
| | | | 257/666 |
| 2014/0291822 A1* | 10/2014 | Keong | H01L 23/495 |
| | | | 257/666 |
| 2015/0243639 A1 | 8/2015 | How et al. | |

* cited by examiner

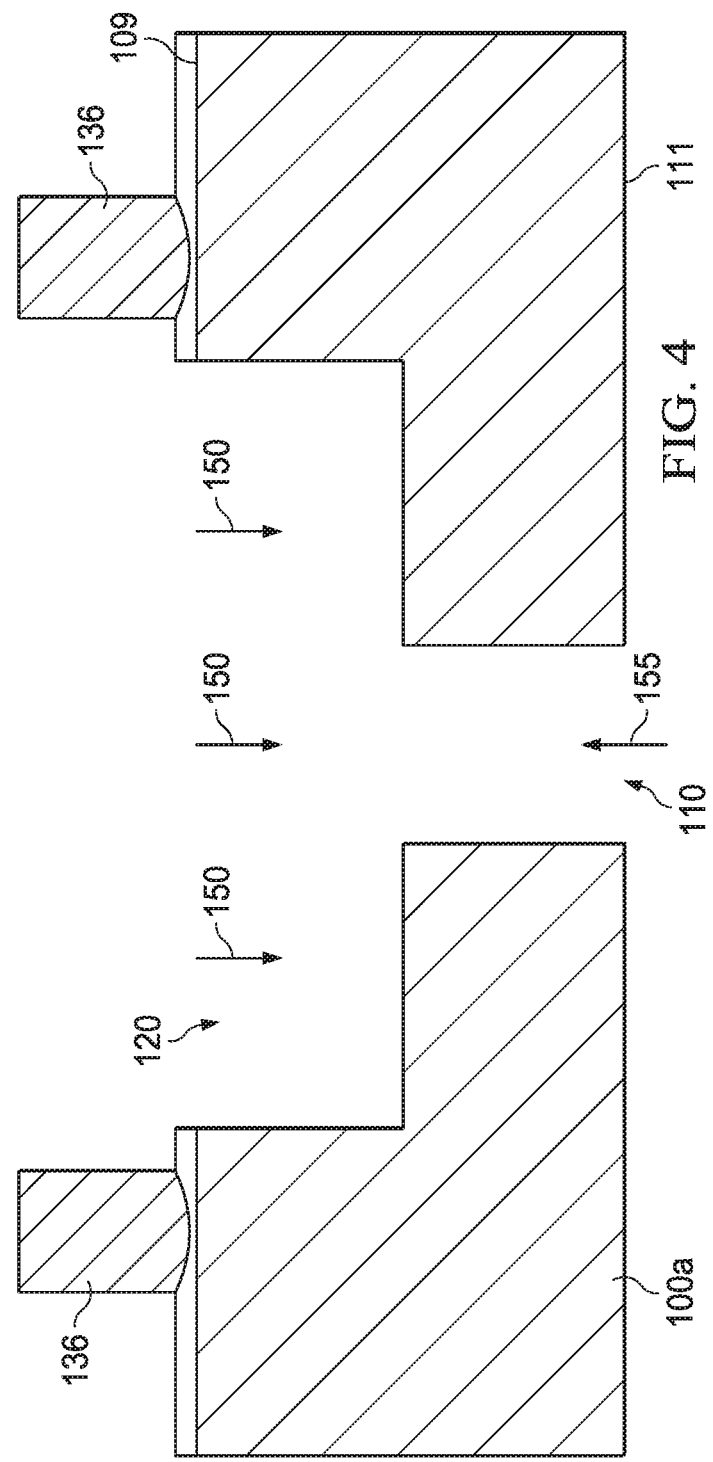

INTEGRATION OF A PASSIVE COMPONENT IN AN INTEGRATED CIRCUIT PACKAGE

CROSS-REFERENCE TO RELATED APPLICATIONS

This application claims priority to U.S. Provisional Patent App. No. 62/484,494 filed Apr. 12, 2017 and U.S. Provisional Patent App. No. 62/612,248 filed Dec. 29, 2017, which are incorporated herein by reference.

BACKGROUND

Many types of integrated circuits (ICs) have input/output (I/O) pins that are used to connect external passive or active components. An IC (also referred to as semiconductor die) often is attached to a leadframe and then surrounded by a mold compound to form a semiconductor package. The package is then attached to a printed circuit board (PCB). A capacitor (or other type of component) may be attached to the same PCB. Through traces on the PCB, the capacitor is electrically connected to one or more I/O pins of the leadframe (and through the leadframe to the IC). The connections between the capacitor and the components within the IC to which the capacitor is connected can create loop inductance which, in some applications such as power converters, can impact the performance of the IC.

In the case of a power converter, loop inductance may necessitate turning the power converter's power transistors on and off more slowly to reduce ringing. However, turning power transistors on and off more slowly results in greater switching losses. As such, trade-offs can be made in the design of a power converter between voltage ringing and switching losses.

SUMMARY

In described examples, a semiconductor package includes a leadframe and a semiconductor die attached to the leadframe by way of solder posts. In a stacked arrangement, the package also includes a passive component disposed between the leadframe and the semiconductor die and electrically connected to the semiconductor die through the leadframe.

Another example is directed to a method that includes etching a conductive member to form a leadframe for a semiconductor die, and disposing solder posts on a surface of the leadframe. The method further includes attaching a passive component to the leadframe on the surface on which the solder posts are disposed. The method also includes attaching the semiconductor die to the leadframe on a side of the leadframe adjacent the surface on which the solder posts are disposed, for sandwiching the passive component between the semiconductor die and the leadframe.

In yet another example, a semiconductor package includes a leadframe and a capacitor coupled to a surface of the leadframe. The package also includes solder posts disposed on the surface of the leadframe to which the capacitor is coupled. The package further includes a semiconductor die attached to the leadframe by way of the solder posts sandwiching the capacitor between the semiconductor die and the leadframe.

BRIEF DESCRIPTION OF THE DRAWINGS

FIG. 4 illustrates yet another embodiment of forming the cavity to include the passive component.

DETAILED DESCRIPTION

The described embodiments pertain to a semiconductor package containing a semiconductor die attached to a leadframe encapsulated in a mold. The package also includes a passive component. The package comprises a stacked configuration in which the passive component is attached to the leadframe either on the same side of the leadframe as the die or on the opposite side of the leadframe. In the embodiments in which the passive component is on the same side of the leadframe as the die, the passive component is mounted in a cavity formed in the leadframe, so that the passive component is sandwiched between the die and the leadframe. In the embodiments in which the passive component is on the opposite of the leadframe from the die, the passive component is also mounted within a cavity formed in the leadframe. The passive component may have electrical contacts to the leadframe and, through the leadframe, connect to particular electrical contact pads to the semiconductor die.

By integrating the passive component into the package containing the semiconductor die in a stacked arrangement of the die, the passive component and the leadframe, the electrical conductors (between the passive component and the die) have reduced lengths, relative to lengths that would have existed if the passive component was outside the package altogether as described hereinabove. By reducing the length of the passive component-to-die conductors, the magnitude of the loop inductance advantageously is reduced.

In the embodiments described hereinbelow, the passive component is a capacitor. However, in other embodiments, the passive component can be other than a capacitor, such as a resistor or inductor. Further, an active component can be mounted in a stacked arrangement with the semiconductor die and leadframe, rather than a passive component.

Figure 1A:
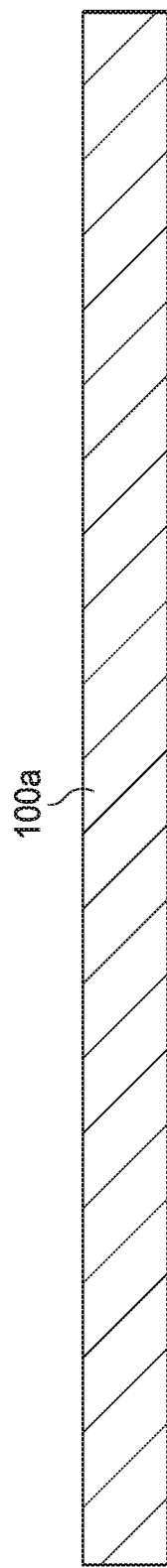
FIGS. 1A-1G illustrate a process for forming a semiconductor package in which a passive component is disposed within a cavity in a leadframe in accordance with an embodiment.

FIGS. 1A-1G illustrate an example of a process for fabricating an embodiment of a semiconductor package with a stacked configuration of a semiconductor die and capacitor. FIG. 1A shows a cross-sectional view of a blank conductive member 100a. The conductive member may comprise copper alloy, or an alloy of another suitable conductive material. The blank conductive member 100 will be processed to form a leadframe 100b as described hereinbelow.

Figure 1B:
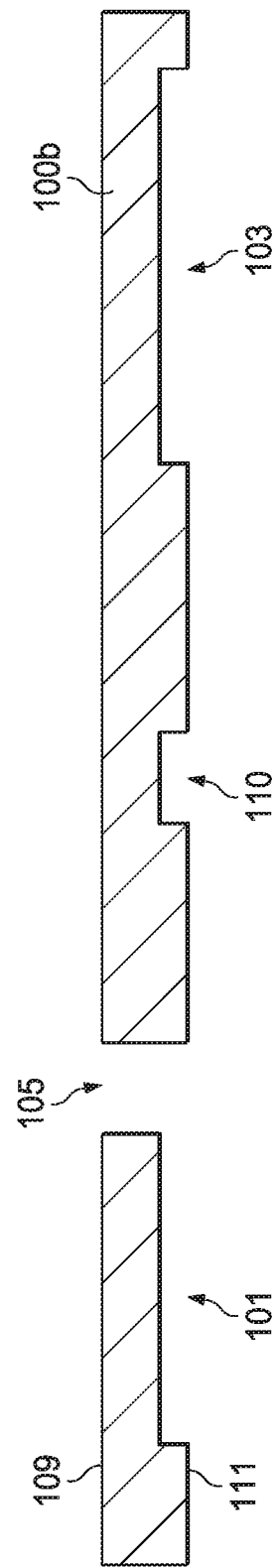

FIG. 1B shows that the blank conductive member 100 has been partially etched to form a leadframe 100b comprising: an upper surface 109 containing portions to which the semiconductor die will be attached; and a lower surface 111 containing portions to mount to a PCB. In the example of FIG. 1B, portions of the conductive material 100 have been removed to form recesses 101, 103 and 105. The recesses 101, 103 and 105 are formed via any suitable process operation, such as etching the copper alloy. For example, copper can be etched by using a ferric chloride ($FeCl_3$)-based etching solution or cupric chloride ($CuCl_2$) in a complex base (e.g., pH greater than 7) solution. The $FeCl_3$ solution is generally more aggressive and faster than the $CuCl_2$ solution, but the $CuCl_2$ solution may be easier to control during manufacturing. A recess 110 also is formed as shown. This particular recess will function to separate portions of the leadframe that will be electrically connected to the capacitor to thereby avoid the capacitor's terminals from being shorted together.

Figure 1C:
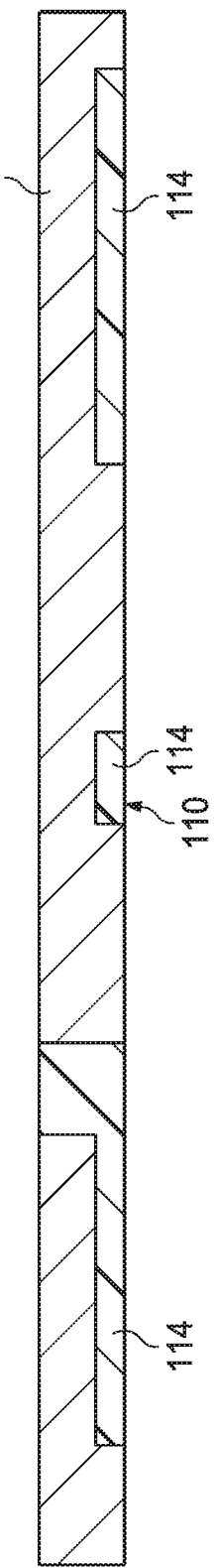

FIG. 1C illustrates the introduction of a pre-mold compound 114 into the recesses 101, 103, 105 and 110. In some embodiments, the pre-mold compound 114 is a silica-based multi-functional aromatic resin. An example of the composition of the mold compound is approximately 60-80% silica, and the rest is a mixture of epoxy resins and additives, which may be included to modify specific properties.

Figure 1D:
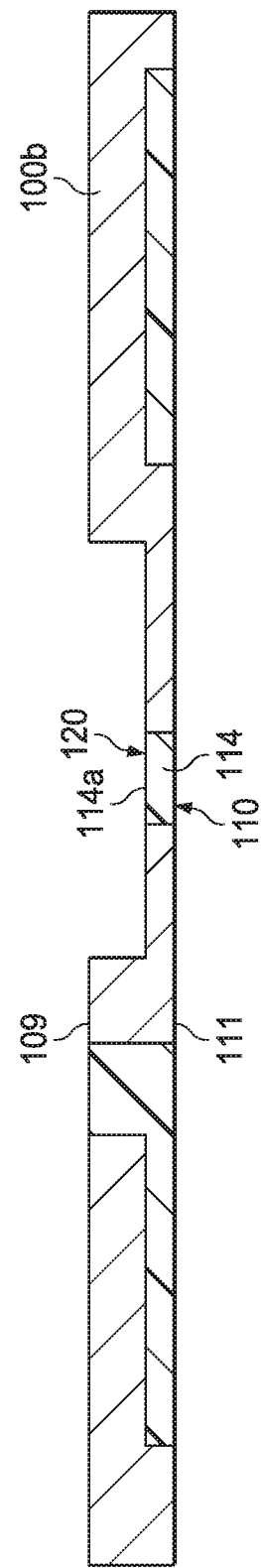

FIG. 1D illustrates that a cavity 120 has been etched in the leadframe 100b. A suitable etching, such as a copper etchant, can be used to etch the conductive material 100 to thereby form the cavity 120. In one embodiment, the conductive material is etched from surface 109 (the surface that will face the die after installation) towards surface 101 (the surface of the leadframe opposite the die). The cross-sectional shape and size can be any suitable shape that accommodates the capacitor.

Figure 1E:
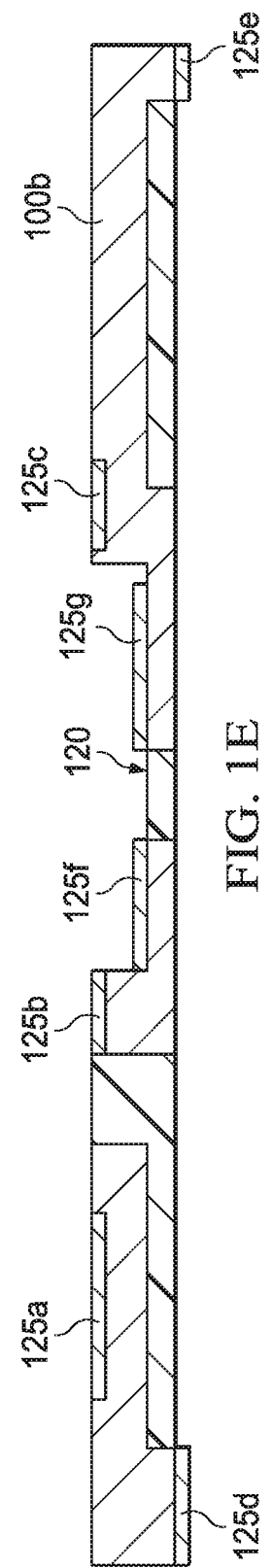

FIG. 1E illustrates a selective metal plating process to thereby form conductive contacts 125a, 125b, 125c, 125d, 125e, 125f and 125g on various portions of the conductive material 100. In this example, the conductive contacts 125a, 125b and 125c will connect the leadframe to the semiconductor die. The conductive contacts 125d and 125e will connect the leadframe to the PCB. Conductive contacts 125f and 125g are formed in the cavity 120 and will provide contact points for the capacitor.

Figure 1F:
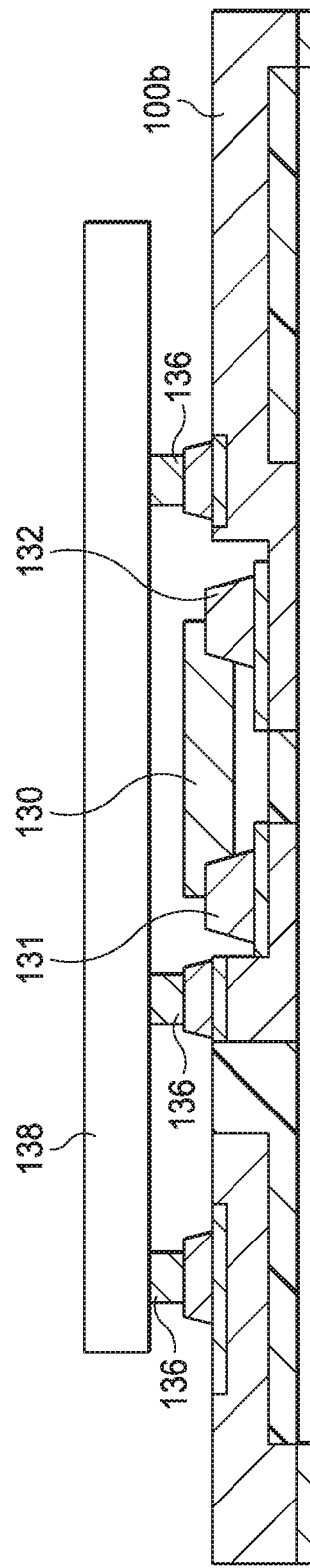

In FIG. 1F, the capacitor 130 has been placed in the cavity 120 and connected to the conductive contacts 125f and 125g via solder balls 131 and 132. FIG. 1F also shows the semiconductor die 138 mounted on the conductive material 100 (i.e., the leadframe) at conductive contacts 125a, 125b and 125c via copper (or other suitable conductive material) posts 136. In this embodiment, at least a portion of the capacitor 130 is disposed within the cavity 120. Due to the height created by the copper posts and conductive pads 125a-125c, a portion of the capacitor 130 protrudes above the cavity as shown. In other embodiments, the entire capacitor is disposed within the cavity, with none of the capacitor protruding above the cavity.

Figure 1G:
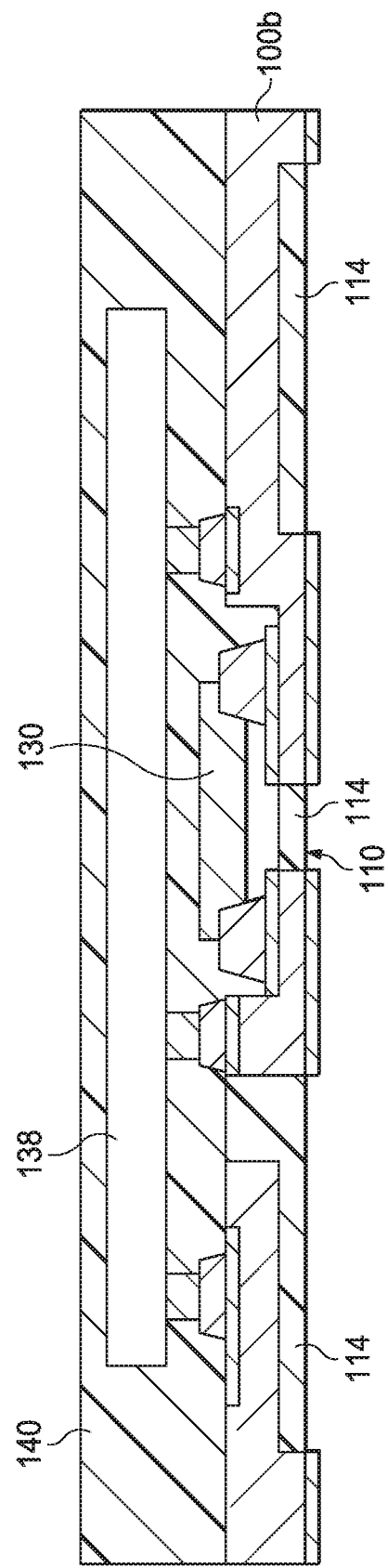

FIG. 1G illustrates the introduction of a post-mold compound 140 to encapsulate the semiconductor die 138 and capacitor 130 as shown to thereby form the semiconductor package. The post-mold compound 140 may be formulated from an epoxy resin containing inorganic fillers (e.g., fused silica), catalysts, flame retardants, stress modifiers, adhesion promoters, and other additives. In one example, a pelletized mold compound is liquefied and transferred to the recesses using a mold press. The liquefaction results in a low viscosity material that readily flows into the mold cavity and encapsulates the device.

Figure 2:
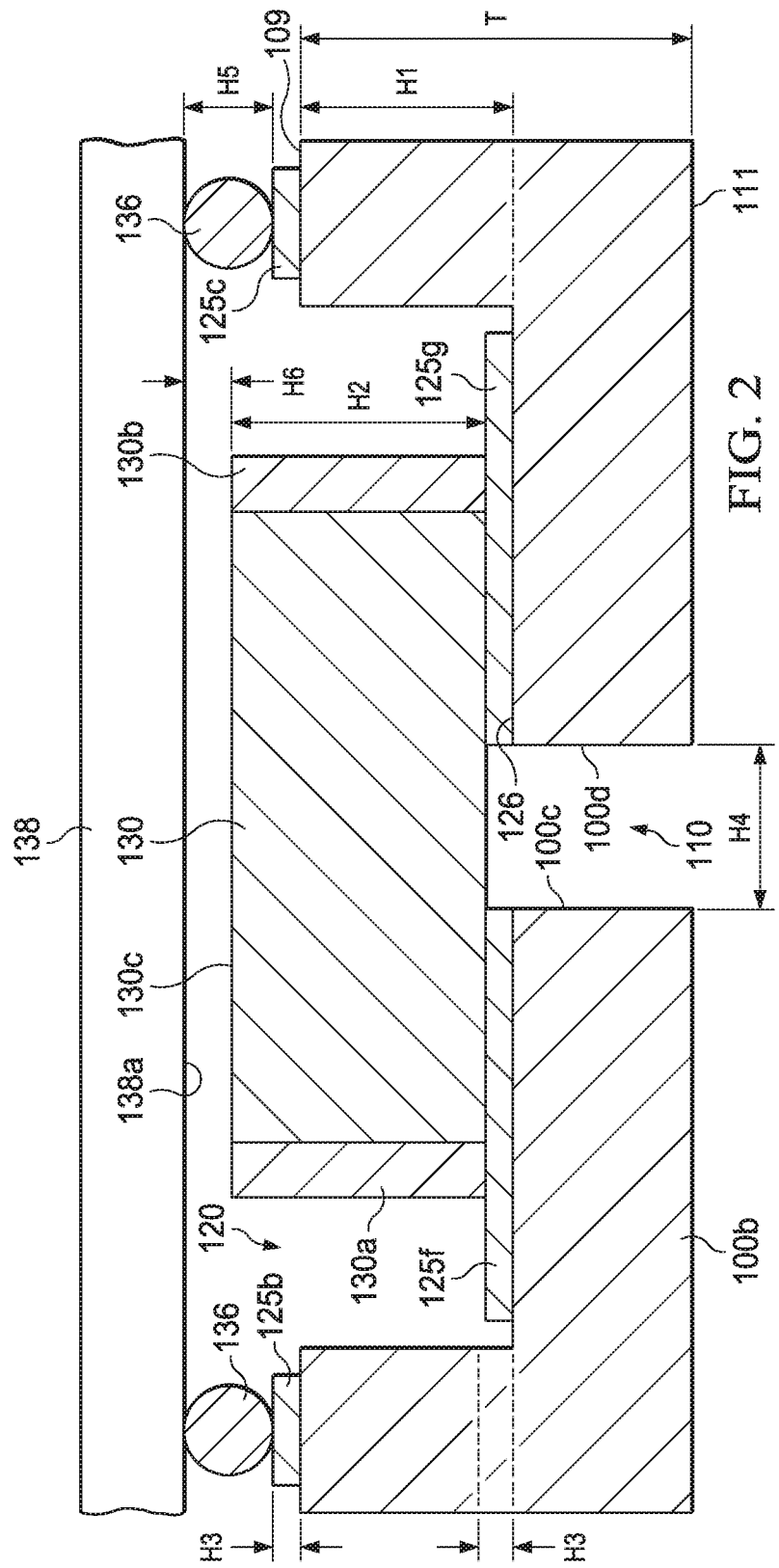
FIG. 2 illustrates dimensions in accordance with the embodiment of FIGS. 1A-1G.

FIG. 2 shows a portion of the semiconductor package of FIG. 1G to identify various dimensions. Electrical contacts 130a and 130b bond to the conductive pads 125f and 125g respectively, as shown. The thickness of the leadframe between surfaces 109 and 111 is designated as T. The cavity 120 has been etched into the leadframe 100b from surface 109 to a depth designated as H1. The height of the capacitor is designated as H2. The height of the contact pads 125b, 125c, 125f and 125g is designated as H3. The spacing between leadframe portions 100c and 100d below the capacitor 130 is designated as H4, and the height of the copper posts 136 is designated as H5. In some embodiments, H1 (the depth of the cavity 120) is approximately 50% of T. In such embodiments, the leadframe is half-etched to form the cavity for the capacitor. The height H2 of the capacitor is less than the combined heights H1 (cavity depth), H3 (height of conductive pads 125b and 125c) and H5 (height of copper posts 136). An additional clearance H6 is also included between the top surface 130c of the capacitor 130 and the bottom surface 138a of the die 138 to allow for mold compound to flow. In one example, T is 200 micrometers ("microns"), H1 (depth of cavity 120) is 100 microns, H3 is 15 microns, and H5 is 60 microns. In this example, the distance from the cavity floor 126 to the bottom surface 138a of the die 138 is the combined heights of H1, H3 and H5, or 175 microns. Thus, the height H2 of the capacitor needs to be less than 175 microns in this example. For example, to permit a gap H6 of 50 microns, the height H2 of the capacitor 120 should be equal to or less than 125 microns. The length H4 of the gap between leadframe portions 100c and 100d may be 170 microns.

As shown in FIG. 2, an inherent gap exists between the top surface 130c of the capacitor 130 and the bottom surface 138a of the semiconductor die 138, due to the height of the copper posts 136 and conductive pads 125b and 125c. Accordingly, in some embodiments, if the capacitor 130 is sufficiently thin, then the capacitor may be installed in that gap without the need for a cavity 120. In some such cases, irrespective of whether a cavity is included, the gap can be increased by using taller copper posts 136 (e.g., 130 microns) to thereby permit the use of thicker capacitors.

In the example of FIG. 1D, the recess 110 is formed by etching the conductive member 100a from surface 111 toward surface 109, and etching 50% of the thickness of the conductive member 100a. In FIG. 1D, the cavity 120 is then formed by etching the leadframe 100b from the surface 109 in the direction of opposing surface 111, and etching 50% of the thickness of the leadframe. The etching is performed until the etching tool just reaches the top surface 114a of the premold compound 114.

Figure 3:
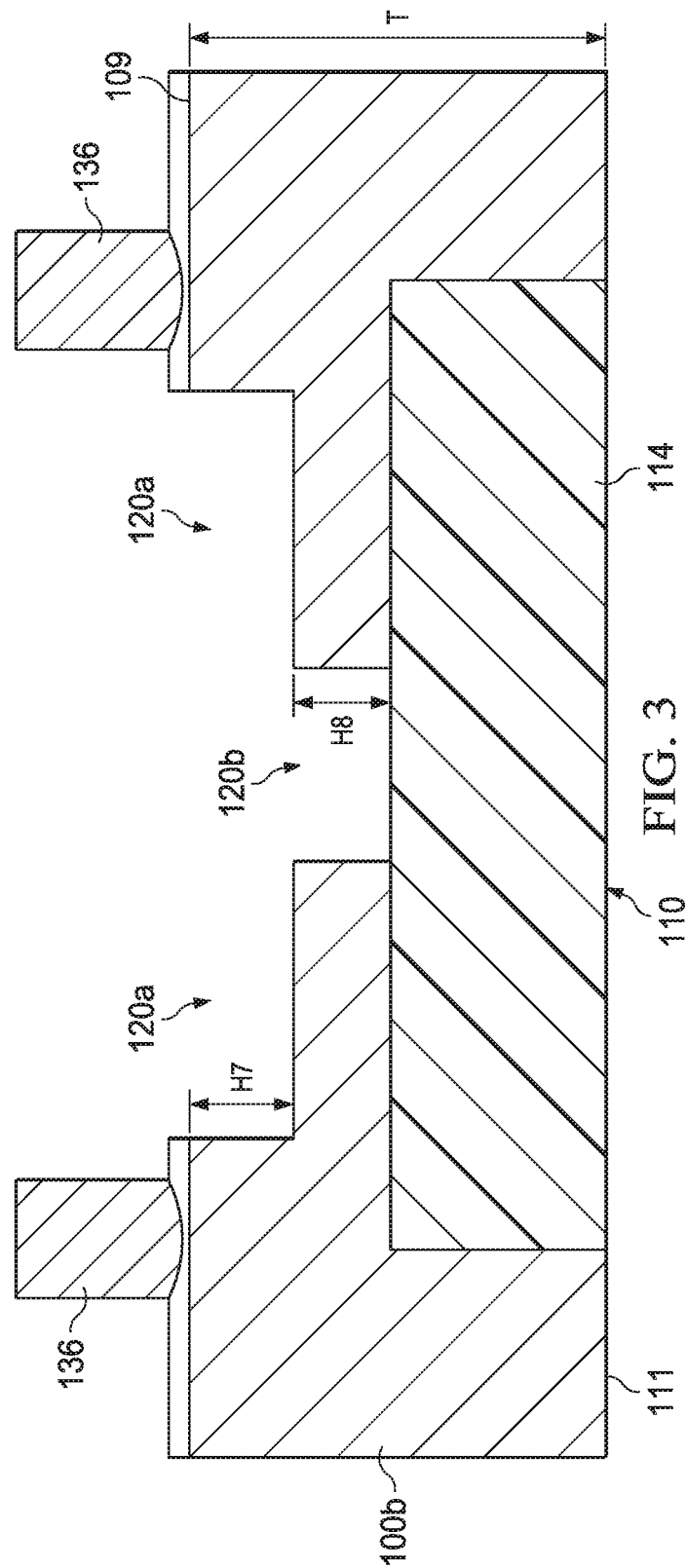
FIG. 3 illustrates another embodiment of forming the cavity to include the passive component.

FIG. 3 shows an alternative embodiment for forming the cavity 120. In this example, the etching tool has etched the leadframe 100b from surface 109 in the direction of surface 111, but less than 50% of the thickness T of the leadframe. Two etching processes are performed in this embodiment. A first etching process is performed to a depth of H7 to form a cavity 120a. A second etching process is then performed in a central region of cavity 120a to a depth of H8 to thereby electrically isolate the leadframe contacts for the capacitor. In one embodiment, H7 is between approximately 20% and 40% of T, and H8 is T minus H7. If the recess 110 containing the mold compound is formed to a depth of 50% of T, and H7 is 20%-40% of T, then H8 is 10%-30% of T.

In the example of FIGS. 1B through 1D, recess 110 is formed and then filled with premold compound 114, and then cavity 120 is etched down to the level of the mold compound. FIG. 4 illustrates an alternative embodiment in which the recess 110 and cavity 120 are formed before the mold compound is introduced into the recess 110. In this embodiment, a two direction etching machine is used to etch the conductive member 100a from both surfaces 109 and 111 in the direction of the other surface. Accordingly, cavity 120 is formed by etching the conductive member 100a in the direction of arrows 150, while recess 110 is formed by etching the conductive member 100a in the direction of arrow 155. The etching process is completed after the recess 110 and cavity 120 are fully formed. This process for forming the cavity 120 is sufficient, even if the etching is less accurate than another embodiment in which recess 110 was already formed and filled with the premold compound 114.

Figure 5A:
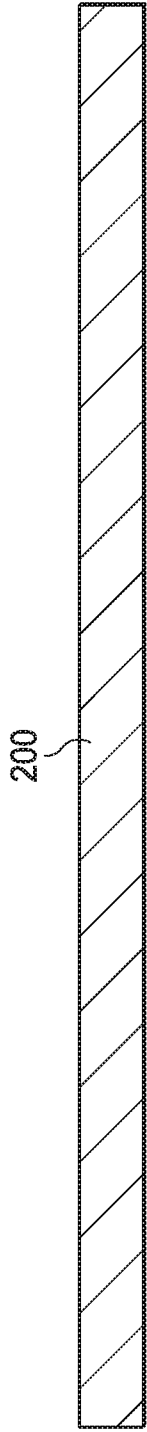
FIGS. 5A-5E illustrate a process for forming a semiconductor package in which a passive component is disposed within a cavity in the leadframe in accordance with an alternative embodiment.
Figure 5B:
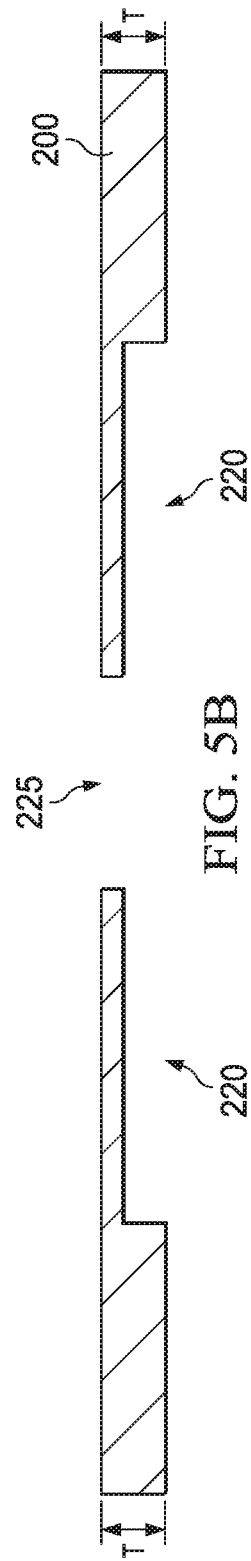

FIGS. 5A-5E illustrate an alternative embodiment for forming the semiconductor package. In this embodiment, the cavity is on a side of the leadframe opposite the semiconductor die, so the cavity is not sandwiched between the leadframe and the die. The process starts with a blank conductive member 200 at FIG. 5A. After the conductive member 200 has been etched and processed, it functions as the leadframe for the semiconductor die. The conductive member may comprise a copper alloy, or other suitable material. FIG. 5B illustrates the formation of a cavity 220 in the conductive member 200, in which the capacitor will be inserted. In this embodiment, the cavity 220 may be etched to a depth of approximately 75% of the thickness T of the conductive member 200. Also, a recess 225 is formed to provide the electrical isolation between the capacitor's contacts.

Figure 5C:
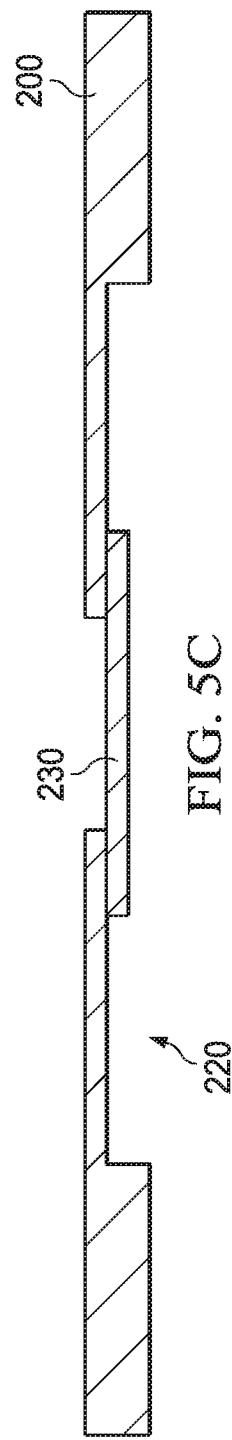
Figure 5D:
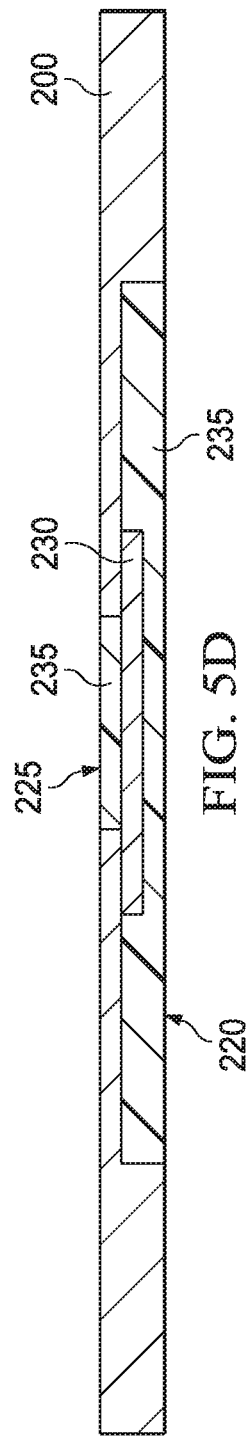
Figure 5E:
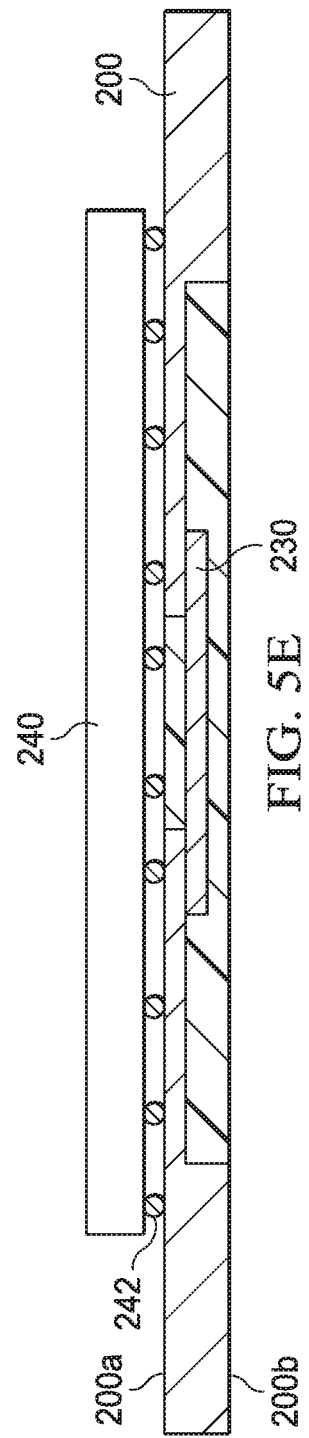

FIG. 5C illustrates that the capacitor 230 has been attached to the conductive member 200 inside the cavity. In this embodiment, the height of the capacitor 230 is equal to or less than the height of the cavity. Accordingly, no portion of the capacitor 230 protrudes out of the cavity. FIG. 5D illustrates that a premold compound 235 is introduced into the cavity 220 and recess 225 and other recesses and cavities formed in the conductive member 200 to form the leadframe. FIG. 5E shows a semiconductor die 240 attached via copper posts or solder balls to a surface 200a of the leadframe, opposite a surface 200b in which the cavity 220 was etched to accommodate the capacitor 230. Although not shown, the semiconductor die 240 and leadframe are encapsulated in a post-mold compound to form the finished semiconductor package.

Figure 6:
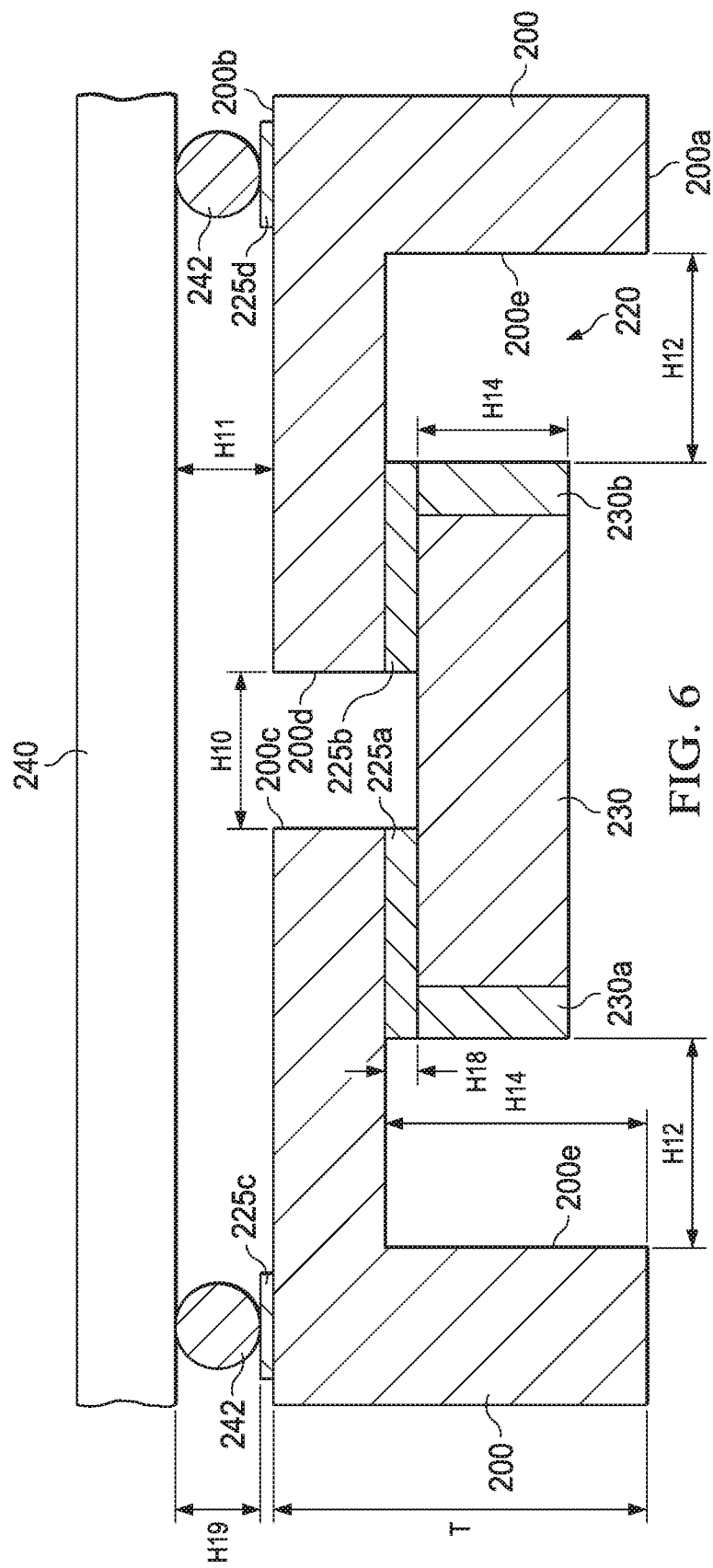
FIG. 6 illustrates dimensions in accordance with the embodiment of FIGS. 5A-5E.

FIG. 6 shows a portion of the semiconductor package of FIG. 5E to identify various dimensions. Electrical contacts 230a and 230b of the capacitor 230 bond to the conductive pads 225a and 225b respectively, as shown. The thickness of the leadframe is designated as T as described hereinabove (although the leadframe thickness need not be the same in every embodiment). The cavity 220 has been etched into the leadframe 200 from surface 200a toward surface 200b to a depth designated as H14. The height of the capacitor is designated as H13. The height of the contact pads 225a, 225b, 225c and 225d is designated as H18. The spacing of the recess between leadframe portions 200c and 200d above the capacitor 230 is designated as H10, and the height of the copper posts 242 is designated as H19. In some embodiments, H14 (the depth of the cavity 220) is approximately 75% of T. In such embodiments, the leadframe is three-quarter-etched to form the cavity 220 for the capacitor 230. The height H13 of the capacitor is less than the height H1 of cavity in some embodiments, so that no portion of the capacitor protrudes out of the cavity 220. In other embodiments, a portion of the capacitor 230 does protrude out of the cavity 230. An additional clearance H11 (e.g., 75 microns) is also included between the top surface 200b of the leadframe 200 and the bottom surface of the die 240 to allow for mold compound to flow. In one example, T is 200 micrometers, H14 (depth of cavity 120) is 150 microns, H18 is 15 microns, and H19 is 60 microns. In this example, the height H13 of the capacitor should be 150 microns (e.g., less than or equal to 135 microns). The length H10 of the gap between leadframe portions 200c and 200d may be 125 microns. The distance H12 between the ends of the capacitor 230 and the side walls 200e of the cavity 220 may be approximately 150 microns.

As shown in FIG. 2, an inherent gap exists between the top surface 130c of the capacitor 130 and the bottom surface 138a of the semiconductor die 138, due to the height of the copper posts 136 and conductive pads 125b and 125c. Accordingly, in some embodiments, if the capacitor 130 is sufficiently thin, then the capacitor may be installed in that gap without the need for a cavity 120. In some such cases, irrespective of whether a cavity is included, the gap can be increased by using taller copper posts 136 (e.g., 130 microns) to thereby permit the use of thicker capacitors.

Figure 7:
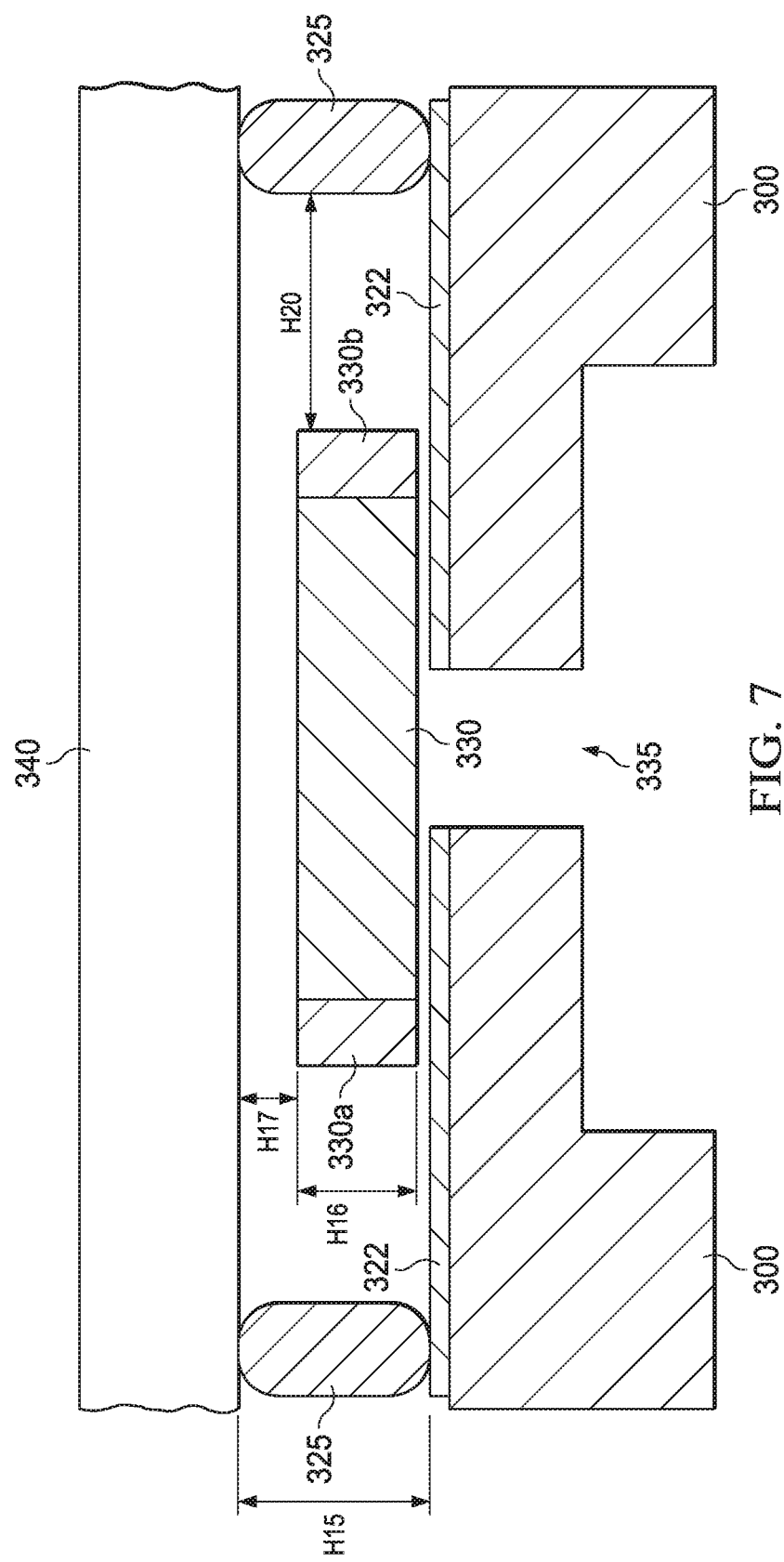
FIG. 7 illustrates an embodiment of a semiconductor package in which a passive component is located between a semiconductor die and a leadframe without the use of a cavity.

FIG. 7 shows an example of a semiconductor package in which a passive component 330 is located between a semiconductor die 340 and a lead frame 300. The passive component may be a capacitor or other type of passive electrical device (e.g., an inductor). In this example, the passive component 330 is not placed within a cavity formed in the leadframe 300. Without the need to etch a cavity for the purpose of placing the passive component, the etching process (of embodiments described hereinabove) is avoided. Instead, solder posts 325 are provided with a height H15 that is sufficiently large to accommodate the height of the passive component. In one example, H15 is approximately 130 microns, in which case the height H16 of the passive component is less than 130 microns (e.g., approximately 80 microns). The dimension H20 represents the spacing between the passive component and the nearest solder post 325. In one example, H20 is approximately 150 microns.

Opposing ends of the passive component 330 include electrical contacts 330a and 330b Electrical contacts 330a and 330b bond to conductive pads 322 as shown to thereby electrical connect the passive component to the lead frame, and through solder posts 325 to the semiconductor die 340. A recess 335 is formed in the leadframe 300 to electrically isolate the electrical contacts 330a and 330b of the passive component 330.

In the example of FIG. 7, a space with a dimension H17 is provided between the passive component 330 and the semiconductor die 340. The space between the passive component and the semiconductor die permits a post-mold compound to encapsulate the semiconductor die 340 and passive component 330 to thereby form the semiconductor package. As described hereinabove, the post-mold compound may be formulated from an epoxy resin containing inorganic fillers (e.g., fused silica), catalysts, flame retardants, stress modifiers, adhesion promoters, and other additives. In one example, a pelletized mold compound is liquefied and transferred to the recesses using a mold press device.

In example embodiments, the term "approximately" means that a value or range of values is either a stated value or range of values or within plus or minus 10% from that stated value or range of values.

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. A semiconductor package, comprising:
   a portion of a leadframe;
   a capacitor coupled to a surface of the leadframe;
   a plurality of solder posts disposed on the surface of the leadframe to which the capacitor is coupled; and
   a semiconductor die attached to the leadframe by way of the plurality of solder posts, sandwiching the capacitor between the semiconductor die and the leadframe;
   wherein a distance between the capacitor and a solder post of the plurality of solder posts is approximately 150 microns.

2. The semiconductor package of claim 1, wherein a height of the solder posts is greater than a height of the capacitor.

3. The semiconductor package of claim 2, wherein the height of the solder posts is approximately 130 microns.

4. The semiconductor package of claim 1, wherein the height of the solder posts is approximately 130 microns.

5. The semiconductor package of claim 4, wherein the height of the capacitor is less than 130 microns.

6. The semiconductor package of claim 5, wherein the height of the capacitor is approximately 80 microns.

7. The semiconductor package of claim 3, further comprising a mold compound encapsulating the capacitor.

* * * * *